United States Patent
Ramappa et al.

(10) Patent No.: US 8,815,634 B2
(45) Date of Patent: Aug. 26, 2014

(54) DARK CURRENTS AND REDUCING DEFECTS IN IMAGE SENSORS AND PHOTOVOLTAIC JUNCTIONS

(75) Inventors: Deepak Ramappa, Cambridge, MA (US); Dennis Rodier, Francestown, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 330 days.

(21) Appl. No.: 12/607,643

(22) Filed: Oct. 28, 2009

(65) Prior Publication Data

US 2010/0110239 A1 May 6, 2010

Related U.S. Application Data

(60) Provisional application No. 61/110,013, filed on Oct. 31, 2008, provisional application No. 61/148,639, filed on Jan. 30, 2009.

(51) Int. Cl.
*H01L 21/00* (2006.01)
*H01L 21/425* (2006.01)
*H01L 27/146* (2006.01)
*H01L 31/18* (2006.01)
*H01L 21/762* (2006.01)

(52) U.S. Cl.
CPC .... *H01L 27/14603* (2013.01); *H01L 27/14683* (2013.01); *H01L 31/1804* (2013.01); *Y02E 10/547* (2013.01); *H01L 21/76237* (2013.01)
USPC ............................................. 438/96; 438/527

(58) Field of Classification Search
None
See application file for complete search history.

(56) References Cited

U.S. PATENT DOCUMENTS

| | | | |
|---|---|---|---|
| 5,244,820 A * | 9/1993 | Kamata et al. | 438/514 |
| 5,565,690 A * | 10/1996 | Theodore et al. | 257/18 |
| 5,811,347 A | 9/1998 | Gardner et al. | |
| 5,859,450 A | 1/1999 | Clark et al. | |
| 6,352,909 B1 * | 3/2002 | Usenko | 438/458 |
| 6,455,385 B1 * | 9/2002 | Alvis et al. | 438/301 |
| 6,570,169 B2 * | 5/2003 | Suguro et al. | 250/492.21 |
| 6,949,445 B2 | 9/2005 | Rhodes et al. | |
| 2004/0107909 A1 | 6/2004 | Collins et al. | |
| 2004/0207024 A1 * | 10/2004 | Eikyu | 257/374 |
| 2004/0251481 A1 | 12/2004 | Rhodes | |
| 2005/0045926 A1 | 3/2005 | Mouli | |
| 2007/0012968 A1 | 1/2007 | Yoshida et al. | |
| 2007/0257315 A1 * | 11/2007 | Bedell et al. | 257/350 |

FOREIGN PATENT DOCUMENTS

| | | | | |
|---|---|---|---|---|
| CN | 1612351 A | 5/2005 | | |
| CN | 101015064 A | 8/2007 | | |
| JP | 2005-251947 A | 9/2005 | | |
| JP | 2007-134423 A | 5/2007 | | |
| KR | 2006077134 A * | 7/2006 | ............ | H01L 27/146 |
| KR | 10-0670537 B1 | 1/2007 | | |

OTHER PUBLICATIONS

KR 2006077134 A, Machine Translation.*

* cited by examiner

*Primary Examiner* — Andres Munoz

(57) ABSTRACT

Dark currents within a photosensitive device are reduced through improved implantation of a species during its fabrication. Dark currents can be caused by defects in the photo-diode device, caused during the annealing, implanting or other processing steps used during fabrication. By amorphizing the workpiece in the photo-diode region, the number of defects can be reduced thereby reducing this cause of dark current. Dark current is also caused by stress induced by an adjacent STI, where the stress caused by the liner and fill material exacerbate defects in the workpiece. By amorphizing the sidewalls and bottom surface of the trench, defects created during the etching process can be reduced. This reduction in defects also decreases dark current in the photosensitive device.

4 Claims, 10 Drawing Sheets

DARK CURRENTS AND REDUCING DEFECTS IN IMAGE SENSORS AND PHOTOVOLTAIC JUNCTIONS

This application claims priority of U.S. Provisional Application Ser. No. 61/110,013, filed Oct. 31, 2008, and U.S. Provisional Application Ser. No. 61/148,639, filed Jan. 30, 2009, the disclosures of which are herein incorporated by reference in their entireties.

FIELD

This disclosure relates to the implantation of species, and more particularly to the implantation of species into photosensitive devices, such as image sensors or photovoltaic (PV) junctions.

BACKGROUND

Photosensitive devices, such as image sensors and PV cells convert light intensities into an electrical signal. An example of an image sensor is a contact image sensor (CIS) that will convert light energy into a voltage. The photodiode is responsible for such photovoltage conversion and this voltage may later be converted into digital data by complementary metal oxide semiconductor (CMOS) circuitry linked to the image sensor.

FIG. 1 is a cross-sectional view of an exemplary photosensitive device, specifically an image sensor 150. The sensor 150 is located on a workpiece, such as a silicon substrate. The photo-diode region 151 includes the P-doped region 152 on the N-doped well 153 contained within a lightly P-doped bulk region 154. In other embodiments, regions 152 and 154 may be N-doped, while region 153 is P-doped. To increase the density of photo-diodes on the surface of a substrate, it may be necessary to isolate them from one another, as leakage may occur between them. One such isolation technique is to incorporate trenches beside or adjacent to each photo-diode, which extend below the photo-diode 151. In FIG. 1, a shallow trench isolation (STI) 155 is disposed next to the photo-diode region 151 in this particular embodiment. A P-well 156 surrounds the STI 155. The photo diode region 151, or the P-N-P doped region, is the image sensor. Another P-well and N-doped region may be disposed adjacent the photo-diode region 151 opposite the STI 155 in one particular embodiment. FIG. 2 is another cross-sectional view of an exemplary image sensor. This figure also shows the mechanisms used to read the voltage stored by the photo-diode, and to reset that voltage.

A second type of image sensor is the back side illuminated (BSI) image sensor. As the name suggests, light enters these devices from the back side (rather than the front side). Like the CIS described above, the BSI sensor utilizes the p-n junction to achieve charge separation.

Another type of image sensor is the charge-coupled device (CCD) image sensor. When light strikes the CCD image sensor, it is held as an electrical charge in the image sensor. The charges are converted to a voltage as these charges are read from the chip containing the CCD image sensor. This voltage may later be converted into digital data by circuitry linked to the CCD image sensor.

FIG. 3 is a cross-sectional view of an exemplary photovoltaic (PV) cell. Other embodiments or designs are possible and the embodiments of the process described herein are not solely limited to the PV cell 120 illustrated in FIG. 3. PV cell 120 includes contacts 121 and backside contact 125. Underneath the dielectric 122 is the emitter 123 and base 124 that make up the P-N junction in the PV cell 120. The emitter 123 and base 124 may be either P-type or N-type depending on the PV cell 120 design. In some instances, this dielectric 122 may be a dielectric passivation layer or an antireflective coating.

As light strikes the PV cell, the photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron hole (e-h) pairs need to be separated. This is done through the built-in electric field at the p-n junction. Thus any e-h pairs that are generated in the depletion region of the p-n junction get separated, as are any other minority carriers that diffuse to the depletion region of the device. Since a majority of the incident photons are absorbed in near surface regions of the device, the minority carriers generated in the emitter need to diffuse across the depth of the emitter to reach the depletion region and get swept across to the other side. Thus to maximize the collection of photo-generated current and minimize the chances of carrier recombination in the emitter, it is preferable to have the emitter region 123 be very shallow.

Some photons pass through the emitter region 123 and enter the base 124. These photons can then excite electrons within the base 124, which are free to move into the emitter region 123, while the associated holes remain in the base 124. As a result of the charge separation caused by the presence of this p-n junction, the extra carriers (electrons and holes) generated by the photons can then be used to drive an external load to complete the circuit.

By externally connecting the emitter region 123 to the base 124 through an external load, it is possible to conduct current and therefore provide power. To achieve this, contacts 121, 125, typically metallic, are placed on the outer surface of the emitter region and the base. Since the base does not receive the photons directly, typically its backside contact 125 is placed along the entire outer surface. In contrast, the outer surface of the emitter region 123 receives photons and therefore cannot be completely covered with contacts.

Performance degradation in both CMOS image sensors and CCD image sensors is driven in part due to parasitic current in the doped junctions that is known as "dark current." Dark current is a parasitic electric current generated by the photo diode in an image sensor that originates due to inherent defectivity in the diode. Defects (such as unpassivated Si vacancies, Si interstitials, interstitial dopants, metal contamination, stacking faults, and dislocations) in the diode act as traps for minority carriers and when the diode is placed in reverse bias, these captured carriers are released. This reverse bias leakage current is referred to as the dark current. Thus, the charge generation rate of the dark current is related to the crystallographic defects in the image sensor, especially in the junction and at the surface of the image sensor. These dark currents degrade the signal-to-noise (S/N) ratio of the image sensor, which may be important to performance of the image sensor.

In an analogous fashion, dark current (or reverse saturation currents, as it is referred to in PV cells) in the P-N junction in a PV cell also is due to inherent defectivity in the junction. This interface degrades minority carrier lifetime in the substrate and leads to the degradation of the efficiency of the PV cell.

FIGS. 4A-4D are an embodiment of image sensor fabrication. In FIG. 4A, the trench 160 is etched. The corners 169 and walls of the trench 160 may be damaged during this etch. Etching will create silicon vacancy clusters (stacking fault nucleation sites) on the sides 170 of the trench 160. Etching also will create irregular asked areas with charge accumulation. In addition, the etch process damages the silicon at the etched surface, often creating dangling bonds. In FIG. 4B, an oxidation and/or nitridation step is performed, creating layer 161. In FIG. 4C, a high density plasma chemical vapor deposition (HDP CVD) step fills the trench 160 with material 162. The layer 161 and material 162 will exert stress and will grow any defects in the trench 160. The excess material 162 is removed using a chemical mechanical polish (CMP) step. FIG. 4D is a finished image sensor. A P-well 168, P-doped region 163, N-doped region 164, N-doped region 166, P-well 165, and transfer gate (TG) 167 are added to the image sensor. Compressive stress (represented by the arrows 600) may be exerted by the trench 160 on the P-doped region 163 and N-doped region 164.

Increasing stress, especially in the STI well, may increase dark current. Stress by HDP CVD may occur when an oxide is used to fill in the STI well 160. During the etching of the STI well 160 (i.e., before HDP CVD), the walls of the silicon are damaged. Defects will grow and proliferate during subsequent processing steps, such as oxide densification or chemical mechanical polishing (CMP). FIG. 5 is a transmission electron microscope (TEM) photographs illustrating dislocations at STI well corners.

The crystallographic defects that cause dark current may be due to multiple sources. First, the defects may be caused by residual damage in the crystal structure following doping, annealing, etching, or other integrated circuit (IC) processes. FIG. 11 shows several sources of dark current in an image sensor, such as the one shown in FIG. 1. The first source of dark current 901 is surface dark current, where imperfections at the interface between the surface and oxide top surface create defects. These defects trap minority carriers. The second cause of dark current 902 is depletion dark current, which is the generation of carriers in the depletion region, caused by interstitials, EOR defects and other substrate defects in the P-doped region. The third cause of dark currents 903 is diffusion of carriers from the doped region, and the fourth source 904 is the diffusion of carriers from the bulk region. These four sources of dark current are all caused by anomalies in the silicon crystal structure, typically created by annealing, implanting, etching or some other IC processing step.

Second, the defects may grow due to induced stress from material, structural, or image sensor layout irregularities. For example, trench isolation feature edges will nucleate defects because the trench corners and sidewalls are rough and defective. Filling the trenches using a HDP CVD will exert a stress on these defects and may proliferate the size of the defects. FIG. 11 shows the current 905 caused by feature related stress.

Dark currents in image sensors are good indicators of the quality of the junction or materials. Hence they are directly related to minority carrier lifetime. Minority carriers in a given doped area are the less abundant charge carrier, which can be either electrons or holes. Carrier lifetime is the average time needed for an excess minority carrier to recombine (i.e., for an electron to combine with a hole or passivate a defect). Light incident on an image sensor will create carriers that are collected and measured as a generated current. Measuring these dark currents in silicon in the presence of external incident light is difficult, as light induced generation of carriers will result in background noise. Isolating the silicon in an isolation system without the presence of light will result in the noise level being lowered and hence enable measuring of the dark current. Reverse biasing a diode in this isolation system allows the true characterization of any inherent defects in the silicon by measuring the leakage current. Existing defects will begin releasing trapped minority carriers, resulting in dark current. Generation lifetime of minority carriers where the capacitor operates in deep depletion is also related to dark currents. Dark current may degrade the S/N ratio of the image sensor and, consequently, may degrade the yield of the image sensor.

Previously, implantation of the STI well using $BF_3$ has been performed at approximately 1E15 to 3E15 using plasma doping to reduce dark currents. Such a high dose of $BF_3$, however, may cause parasitic currents in the image sensor. Other high dose implants also may cause damage or defects to the image sensor. Similarly, the doping of ions in the p and n regions in the photo diode may cause defects in the material, which lead to increased dark current.

Accordingly, there is a need for improved methods implanting a species in an image sensor or PV cell, and, more specifically, to implantation of a species in an image sensor or PV cell to improve dark currents and reduce defects.

SUMMARY

Dark currents within a photosensitive device are reduced through improved implantation of a species during its fabrication. Dark currents can be caused by defects in the photo-diode device, caused during the annealing, implanting or other processing steps used during fabrication. By amorphizing the workpiece in the photo-diode region, the number of defects can be reduced thereby reducing this cause of dark current.

Dark current is also caused by stress induced by an adjacent STI, where the stress caused by the liner and fill material exacerbate defects in the workpiece. By amorphizing the sidewalls and bottom surface of the trench, defects created during the etching process can be reduced. This reduction in defects also decreases dark current in the photosensitive device.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
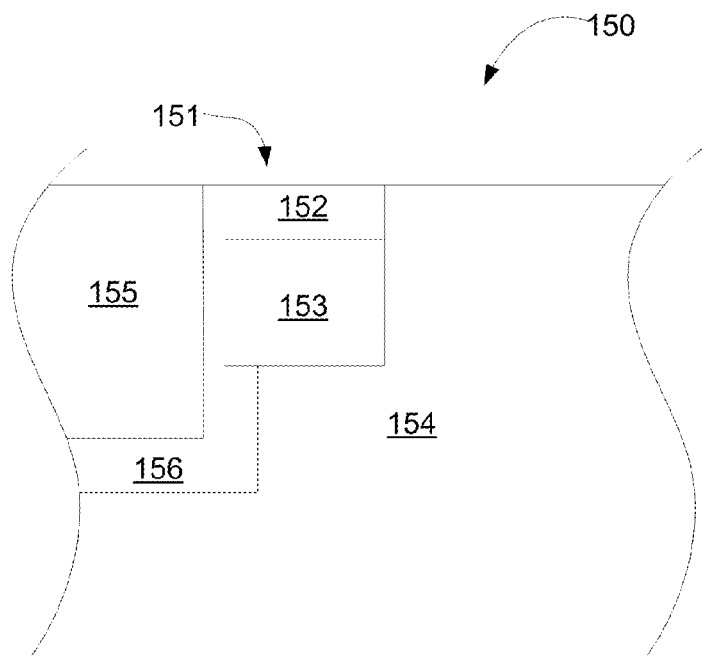
FIG. 1 is a cross-sectional view of an exemplary image sensor.
Figure 2:
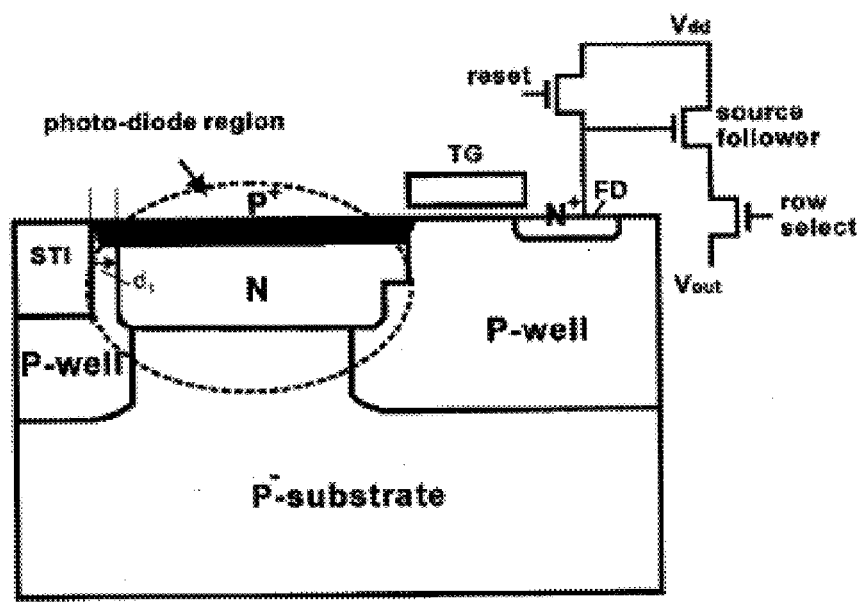
FIG. 2 is another cross-sectional view of an exemplary image sensor.
Figure 3:
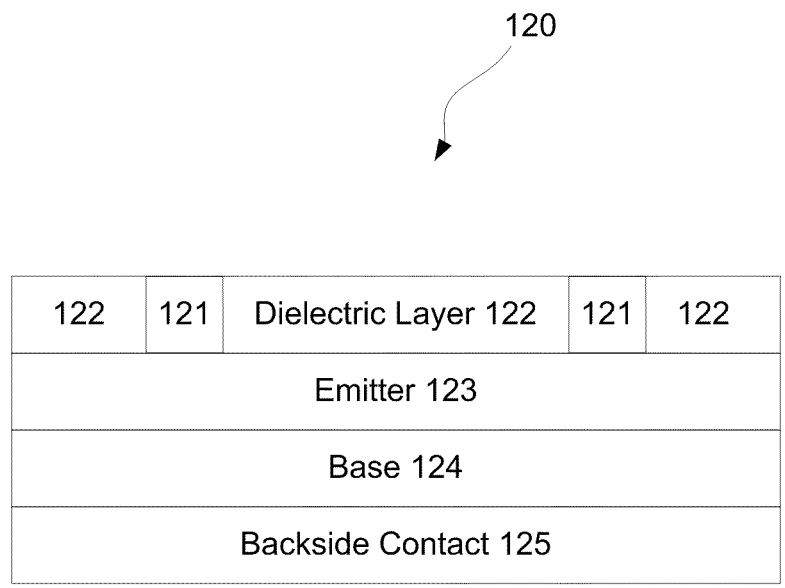
FIG. 3 is a cross-sectional view of an exemplary PV cell.

FIG. 6A-6D are an embodiment of implantation to reduce stress in an STI. In FIG. 6A, the trench 160 is etched. The corners 169 and sidewalls 170 of the trench 160 may be damaged during this etch. For example, etching will create silicon vacancy clusters (stacking fault nucleation sites) on the sides 170 of the trench 160. Etching also will create irregular asked areas with charge accumulation.

In FIG. 6B, an oxidation and/or nitridation step is performed, creating layer 161. This can be performed via furnace or deposition. In FIG. 6B, a species 500 is also implanted into the walls and bottom of the trench 160. This may before, after, or at least partly during the placement of the layer 161. The species 500 will amorphize the silicon around the trench 160, forming amorphized region 501. This amorphizing will destroy or remove the long-range order of the crystal lattice. This amorphized region 501 will remove some damage created by the etch of the trench 160 in FIG. 6A, will homogenize the walls 170 of the trench 160, and will remove any vacancy clusters or future nucleation sites. Thus, the walls 170 of the trench 160 may grow back in true or proper crystal form during an anneal.

This amorphized region 501 may remove stress defects that have nucleated along the stress boundaries of the trench 160. Stress defects are caused by the layer 161 that fills the trench 160. A high density of layer 161 will exert stress on the walls of the trench 160. Any defects already present on the wall of the trench 160 will grow due to this stress, thus creating stress defects. If the layer 161 fills the trench 160, there is less room for the material 162, thus increasing stress. The amorphized region 501 may reduce or limit growth of the layer 161 on the walls of the trench 160, which otherwise may increase stress.

Figure 4:
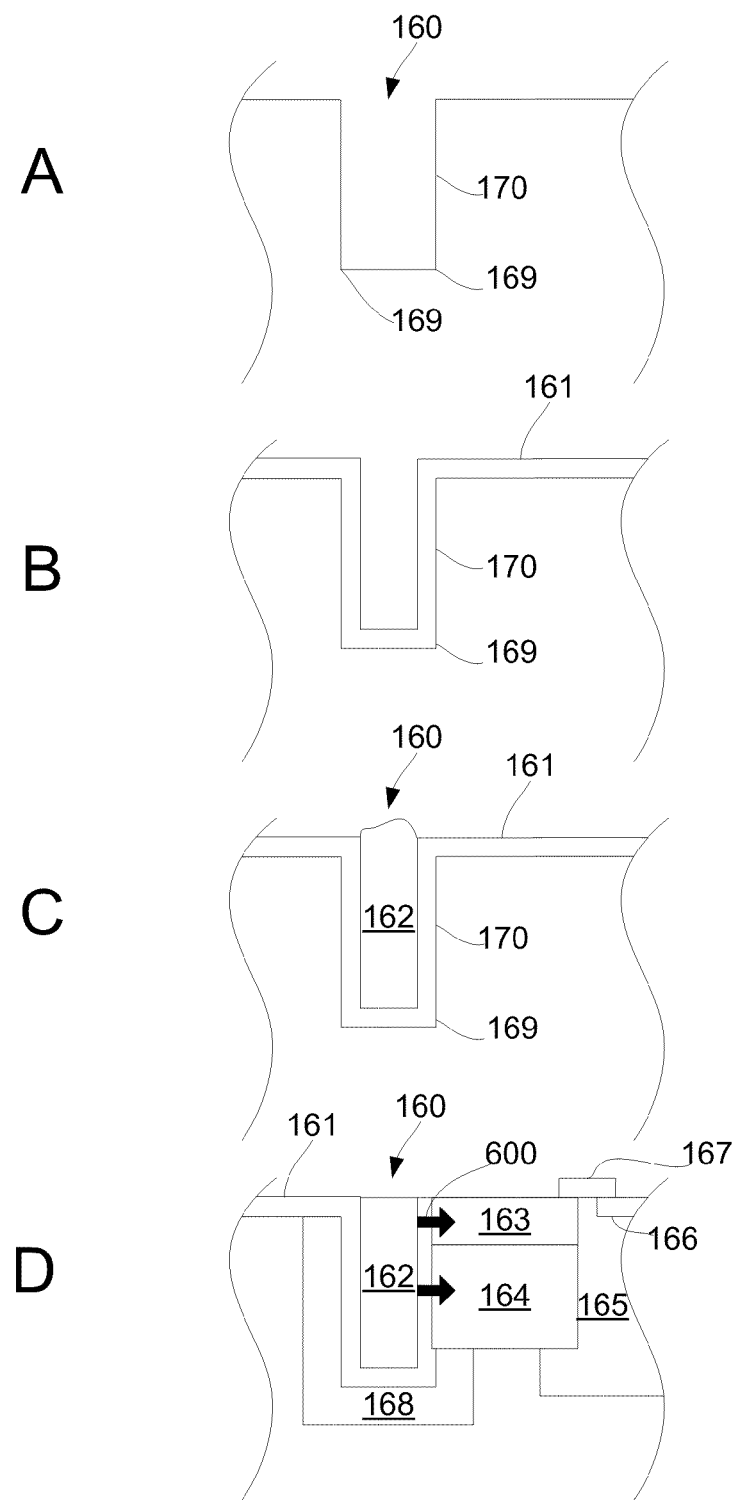
FIGS. 4A-4D are an embodiment of image sensor fabrication.
Figure 5:
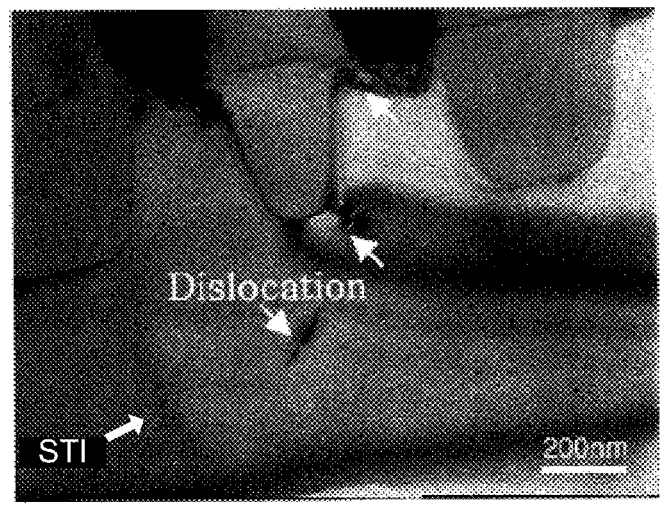
FIG. 5 is TEM photographs illustrating dislocations at STI well corners.

In FIG. 6C, a HDP CVD step fills the trench 160 with material 162. This material is usually a high density oxide, however some organic dielectrics may also be used. The excess material 162 is removed using a chemical mechanical polish (CMP) step. FIG. 6D is a finished image sensor. A P-well 168, P-doped region 163, N-doped region 164, N-doped region 166, P-well 165, and TG 167 are added to the image sensor. In an alternate embodiment, the P-well 165 and/or P-well 168 are doped prior to etching the trench 160. Compressive stress (represented by the arrows 600) may be exerted by the trench 160 on the P-doped region 163 and N-doped region 164. The level of stress, however, may be reduced compared to the image sensor of FIG. 4 because of the presence of the amorphized region 501. The implant 500 amorphizes a defective region and removes defects. This will enable a defect free crystal growth along the walls. Thus, there is no need for a separate anneal. Processes that follow STI formation (such as the formation of the p-n junction) and their associated thermal processing, provide the thermal budget needed for these amorphized sidewalls to grow. This may reduce dark currents.

The species 500 may be any type of amorphizing species. While doping species may be used, non-doping species such as He, H, Ar, Kr, Ne, Xe, Si, Ge, O, or N, may be used for species 500 in one particular embodiment. Other non-doping species also may be used. In one embodiment, it may not be desirable to implant the trench 160 with a doping species. While implanting the walls of the trench 160 with a doping species may create an accumulation surface, it also may create parasitic effects in the IC because it may form another diode under the trench 160.

An angled implant compared to the surface of the image sensor may improve amorphization of the amorphized region 501 and allow amorphization of both the walls and bottom of the trench 160. The angled implant, in this case, means that the implant is not perpendicular to the surface of a substrate or perpendicular to the bottom of the trench 160. FIG. 6B illustrates two angled implants, but other numbers of implant steps or particular angles are possible. The dose range for the amorphizing implant may be between approximately 1E11 and 1E15. The implant angle and implant energy are configured based on the aspect ratio (i.e., height to width) of the trench 160. The implant energy may be between approximately 0.5 keV and 20 keV. Other doses and energies are possible and the embodiments of the process described herein are not limited to these particular doses and energies.

The ability for a species to amorphize the workpiece is a function of the species being implanted, the workpiece material, and the dose rate used. The dose rate of an implanted species that causes the workpiece to become amorphized is known as the amorphization threshold. For example, at high dose rates (such as 1e15), $BF_2$ will amorphize silicon. However, at lower dose rates, it may not. Similarly, at this same dose rate (1e15), boron (due to its lighter mass) will not amorphize a silicon workpiece. In fact, boron has an amorphization threshold of about 7e15. The degree of amorphization affects the amount of damage that is caused in the workpiece.

Figure 7:
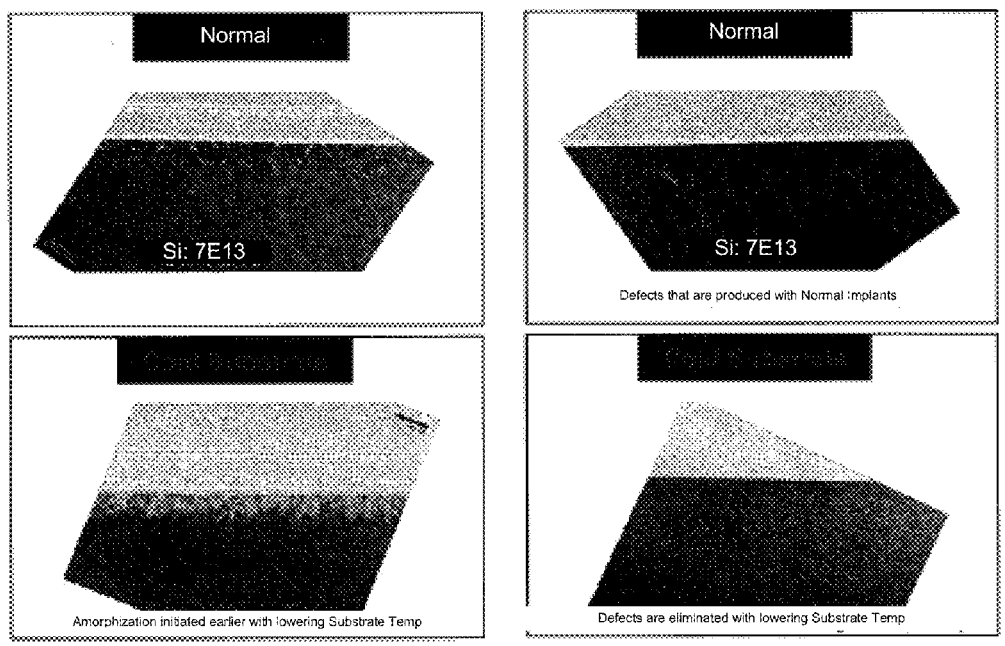
FIG. 7 illustrates the reduced defects in a workpiece caused by lower temperatures.

To minimize the damage caused by the implants, the temperature of the implant can be modified. For implants that occur at dose rates above the amorphization threshold, a cold implant may be used to reduce damage. Similarly, if the dose rate is close to the amorphization threshold, a cold implant may be preferred. In one particular embodiment, the workpiece is maintained between approximately +30° C. and −200° C., more particularly, between 0° C. and −200° C. Other temperatures are possible and the embodiments of the process described here are not limited merely to between approximately +30° C. and −200° C. Lower workpiece temperatures will lower the threshold where a species can amorphize the workpiece and also may improve the amorphization quality. Amorphization quality is improved at lower temperatures because the crystal lattice of the trench 160 may be closer together compared to the crystal lattice at a higher temperature. Lower temperatures also reduce end-of-range (EOR) defects caused by the implant. EOR in a silicon lattice is a plurality of silicon interstitials that have been knocked out to just below the EOR. Cold temperatures lower the amorphization threshold and will increase the amorphization caused by a certain dose of species 500. Therefore, more substitutional vacancies are created more uniformly in the crystal lattice down to the EOR. During a later anneal, recrystallization will start at the interstitials at the EOR and will move upward, causing stress and EOR defects. By more thoroughly amorphizing a given area, every interstitial is provided a better opportunity to get back into its substitutional site, thus reducing EOR defects. Cold implants also may lower the required dose to amorphize. FIG. 7 illustrates the reduced defects in a workpiece caused by lower temperatures. Increased amorphization and reduced defects may reduce dark current.

An improvement of substrate quality following a lower temperature or cold implant is shown by comparing minority carrier lifetimes. A normal implant of phosphorus (140 keV, 5E13, anneal at 950° C.) yielded a minority carrier diffusion length of 200 μm. The same implant performed at −60° C. yielded a minority carrier diffusion length of 310 μm. This is more than a 50% improvement in lifetime and, consequently, crystal quality.

However, if the desired dose rate of the implanted species is much less than the amorphization threshold, a hot implant is performed to reduce defects and reduce damage to the crystal lattice. This hot implant may be, for example, between 60° C. and 900° C. Backside gas cooling/heating, pre-heating, resistively heated platen, or lamps, for example, may be used to heat the substrate to this elevated temperature. The implant will knock out Si atoms from the crystal lattice. Some of these knocked-out Si atoms may move to the interstitial space of the crystal lattice and substitutional spaces are formed. Performing a heated implant allows some of these knocked-out Si atoms to move back from the interstitial space to the crystal lattice. This leads to less amorphization and less vacancy defects compared to an unheated implant. This means that less damage will need to be repaired during an anneal.

Heated implants may be used for implant doses that are below the amorphization threshold or amorphization level. Fewer vacancies will be created with a heated implant at these particular doses. In one instance, the implant dose range may change with a heated implant compared to an unheated implant.

Figure 6:
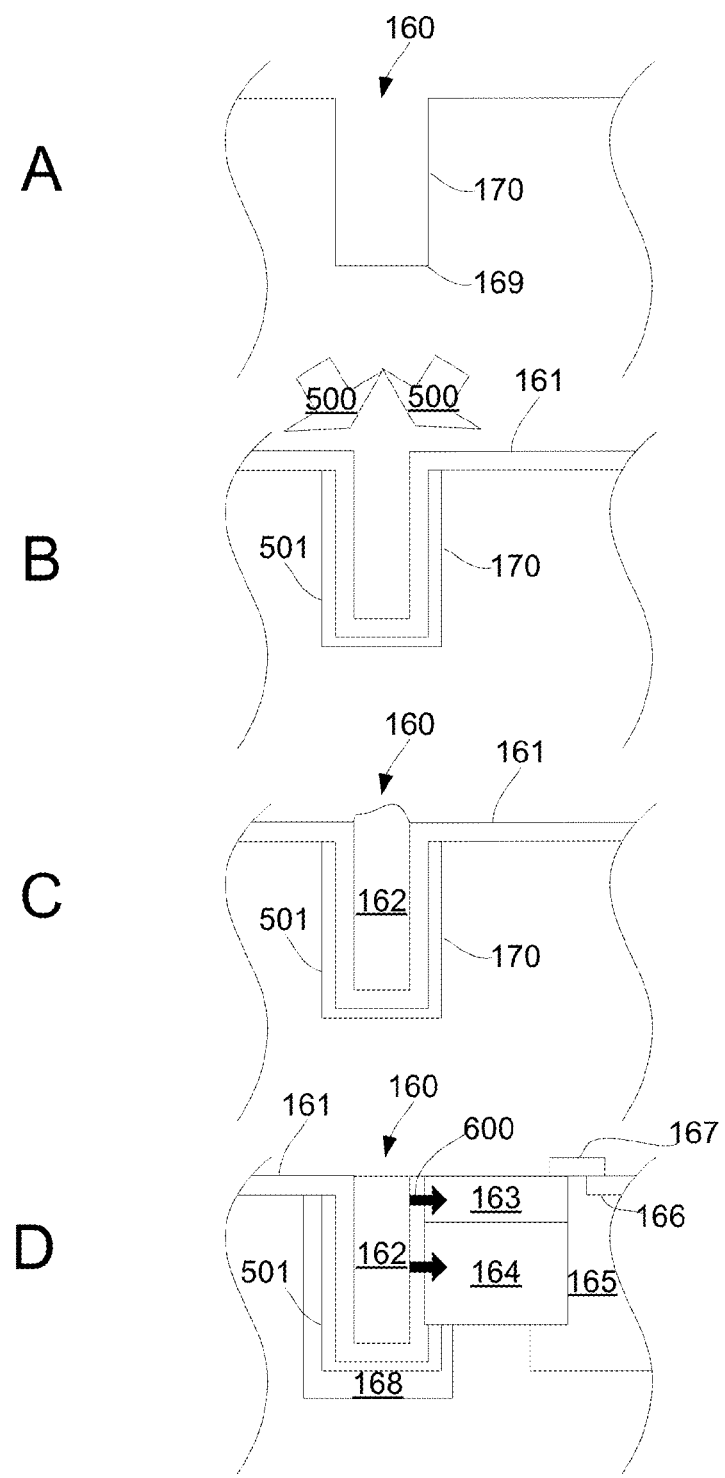
FIGS. 6A-6D are an embodiment of implantation to reduce stress in an STI.
Figure 11:
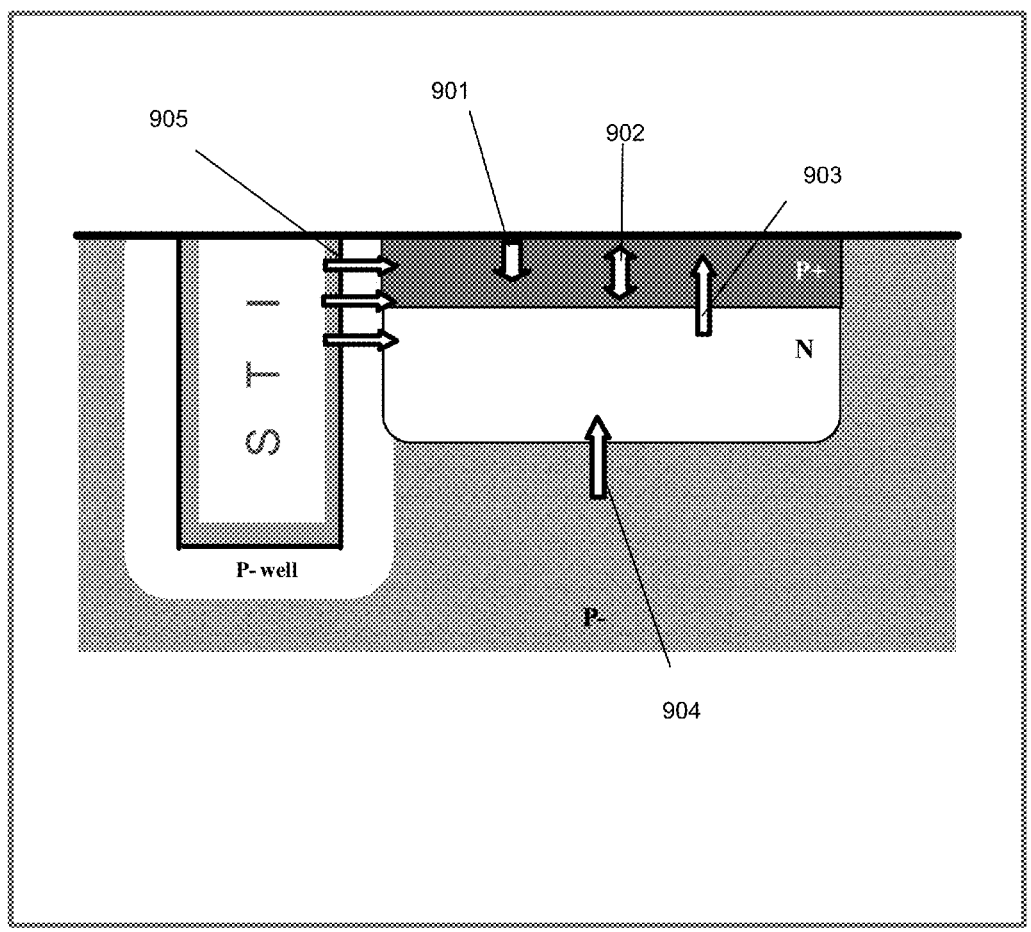
FIG. 11 represents the source of dark current in an exemplary image sensor.

FIG. 6 demonstrates a method to reduce dark currents that result from feature driven strain in the substrate (labeled as (5) in FIG. 11). In this particular embodiment, the strain results from the formation of an STI.

Figure 8:
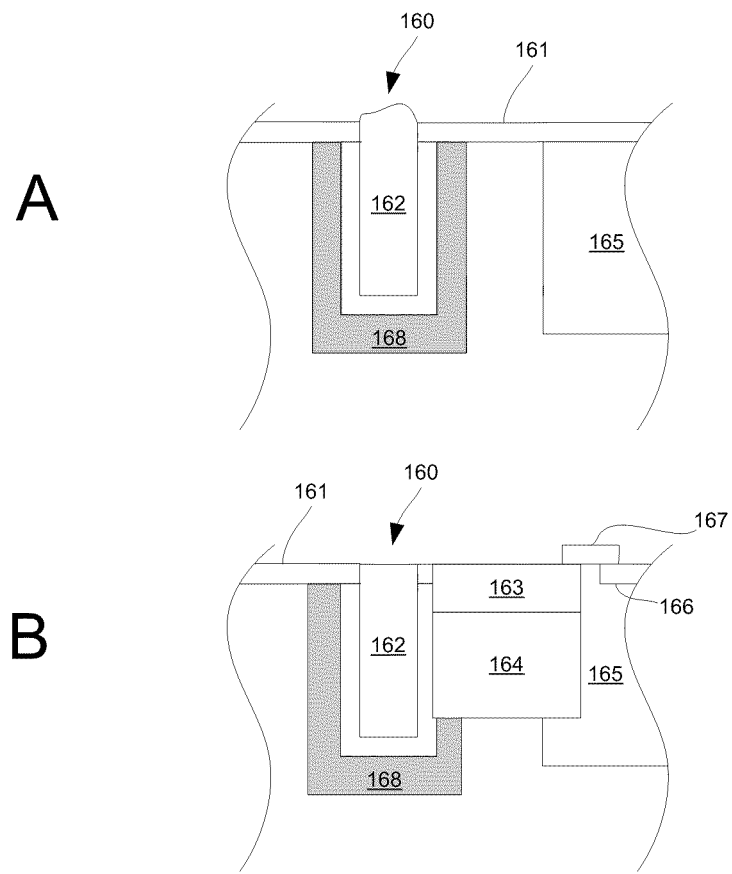
FIGS. 8A-8B are an embodiment of implantation to reduce well implant defectivity.

FIG. 11 also shows several other causes of dark current, which are related to anomalies in the crystalline structure, typically caused by the processing of the substrate. FIGS. 8A-8B are an embodiment of implantation to reduce well implant defectivity. In FIG. 8A, the P-well 165 and P-well 168 have been doped and the trench 160 is etched, which may have caused damage to the corners and sidewalls of the trench 160. An oxidation and/or nitridation step also has been performed, creating layer 161, and a HDP CVD step has filled the trench 160 with material 162. The excess material 162 is removed using a chemical mechanical polish (CMP) step.

FIG. 8B is a finished IC. A P-doped region 163, N-doped region 164, N-doped region 166, and TG 167 as added to the IC. The P-well 165 and P-well 168 are doped either before or after etching the trench 160.

Forming the P-well 168 or P-well 165 may require a high energy implant. Such a high energy implant may cause defects in, for example, the P-well 168. These defects cause degradation of minority carrier lifetimes, which correlate to dark currents in the junctions. Defects in the silicon lattice of the P-well 168 may act like "traps" for minority carriers because the defects have unpassivated bonds that are passivated by the minority carrier. In one instance, this is an electron for a P-type region. When a certain amount of light energy is absorbed by a P-N junction, it excites and forms electron-hole pairs. These pairs start drifting toward the respective conduction or valence band. Once a carrier has reached such a band, the carrier is counted, which determines the amount and type of light energy received. Defects in the silicon will trap the carriers, preventing the carriers from reaching the bands. The minority carrier lifetime is an estimation of how long a carrier will survive in the crystal lattice before being captured by a defect. A high defect density will lower carrier lifetime. Similarly, a low defect density will increase the carrier lifetime. This lifetime is estimated because the number of generated carriers is known, but if these carriers are not measured then it may be assumed that the carriers were trapped.

To minimize these defects and to reduce residual damage caused by the implantation, the P-well 168 or P-well 165 may be implanted at a low dose, and at an elevated temperature. In the embodiment of FIG. 8A, only the P-well 168 is implanted. Any species typically used for the P-well 168 implant may be used, including B, $BF_3$ or P. The dose for the implant may be between approximately 1E11 and 1E14. The implant angle and implant energy are configured depending on the required depth of the P-well 168. The implant energy may be between approximately 50 keV and 6 MeV, for example. Other energy ranges and doses are also possible and the embodiments of the process described herein are not limited to between approximately 50 keV and 6 MeV or 1E11 and 1E14.

In another embodiment, the P-well 168 is implanted and the walls of the trench 160 also are amorphized similar to the embodiments of FIGS. 6A-6D.

In another embodiment, the P-doped region 163 and N-doped region 164 are amorphized to reduce dark currents.

FIG. 11 shows that dark current can result from the generation of carriers in the depletion region, caused by interstitials and EOR defects. Similarly, dark currents can result from the diffusion of carriers from the doped junction and from the bulk region. By amorphizing the P-doped region 163 and/or the N-doped region 164, the number of defects in these areas can be decreased, thereby leading to a reduction in the dark currents. All doping implants may leave residual damage. To minimize this damage, cold implants are performed if the dopant implant dose employed is above the amorphizing threshold. Conversely, hot implants are used if the dopant dose is below its amorphizing threshold. These type of modified implants help reduce the total residual damage post anneal and hence results in better doped region performed.

In yet another embodiment, regions of a PV cell are amorphized to improve minority carrier lifetime, improve dark currents, or reduce defects. This will enable in improvement in efficiencies in PV cells. Specifically, the P-N junction, emitter, or base may be amorphized. Other regions of the photovoltaic cell likewise may be amorphized. This includes selective emitter implants, contact implants, buried junction implants, back surface field implants and isolation implants. These implants can be performed through masks in one embodiment. All doping implants may leave residual damage. To minimize this damage, cold implants are performed if the dopant implant dose employed is above the amorphizing threshold. Conversely, hot implants are used if the dopant dose is below its amorphizing threshold. These type of modified implants help reduce the total residual damage post anneal and hence results in better doped region performed. This can be measured as an improvement if reverse saturation currents of the doped region or dark currents.

Figure 12:
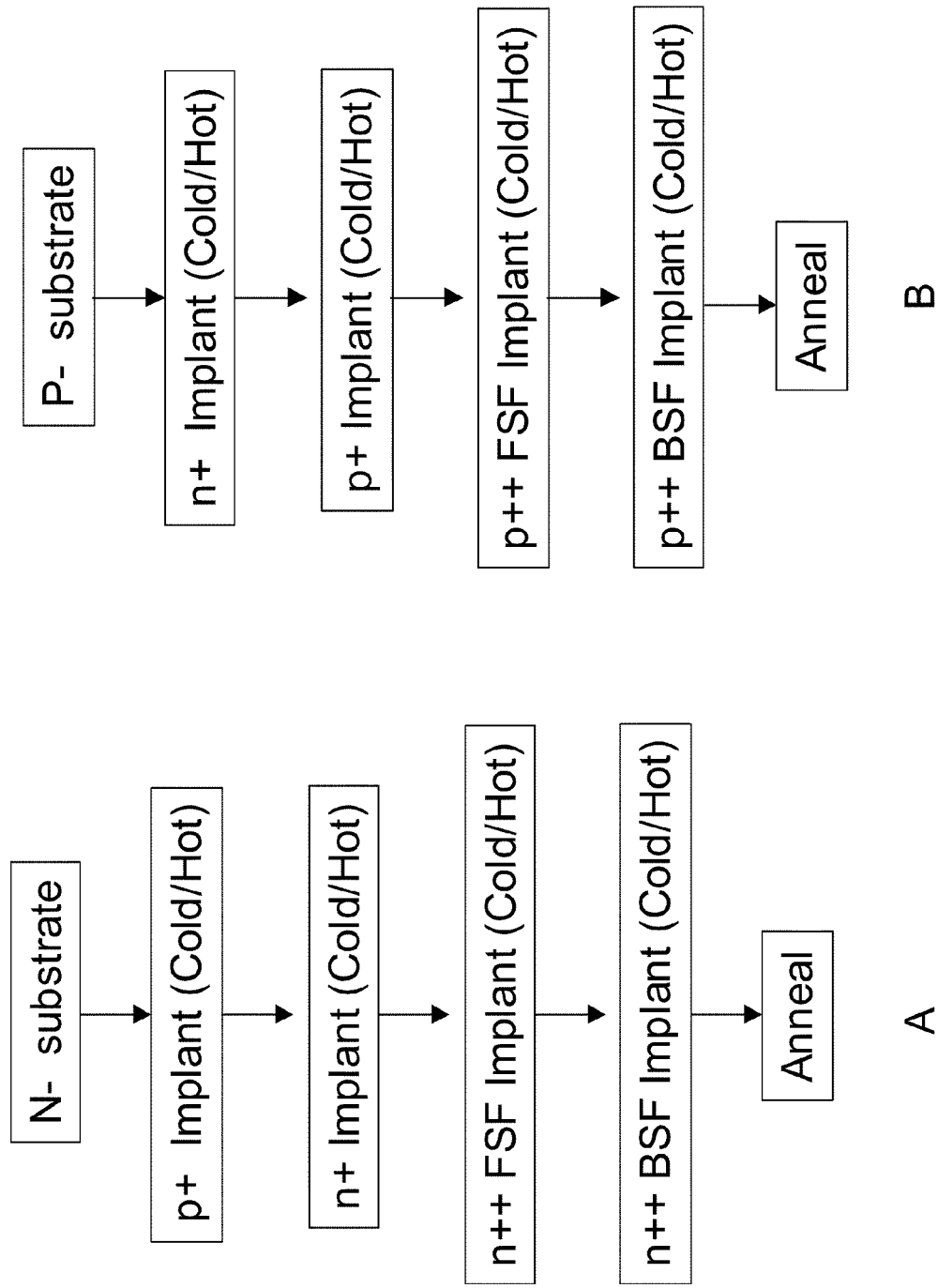
FIGS. 12A-B are flowcharts showing the implanting of dopants to form a p-n junction.

FIGS. 12A-B show the respective flowcharts for an N-type substrate and a P-type substrate, such as for use with a solar cell. In FIG. 12A, the substrate is assumed to be N-type. In this embodiment, a p-type implant is performed first, followed by a n-type implant. After the p-n region has been formed, n++ implants are performed on the front and back sides. Note that each of these processes may be performed at a temperature that minimizes defects. As explained above, cold implants are best if the implant dose is greater than the amorphizing threshold, while hot implants are best suited for doses below the amorphizing threshold. FIG. 12B shows a similar process for the scenario for a p-type substrate.

The implants disclosed in the embodiment herein can be used with any type of photosensitive device, including CIS, BSI image sensors, CCD sensors, and PV cells. In the case where surface accumulation layers are needed to form front surface fields (FSF) or back surface fields (BSF) (as is the case of BSI Image sensors), these implants can also be performed with cold/hot implants based on the dose and species type. As is the case with the other photosensitive devices, these implants reduce the defectivity and hence the source of dark currents.

Figure 9:
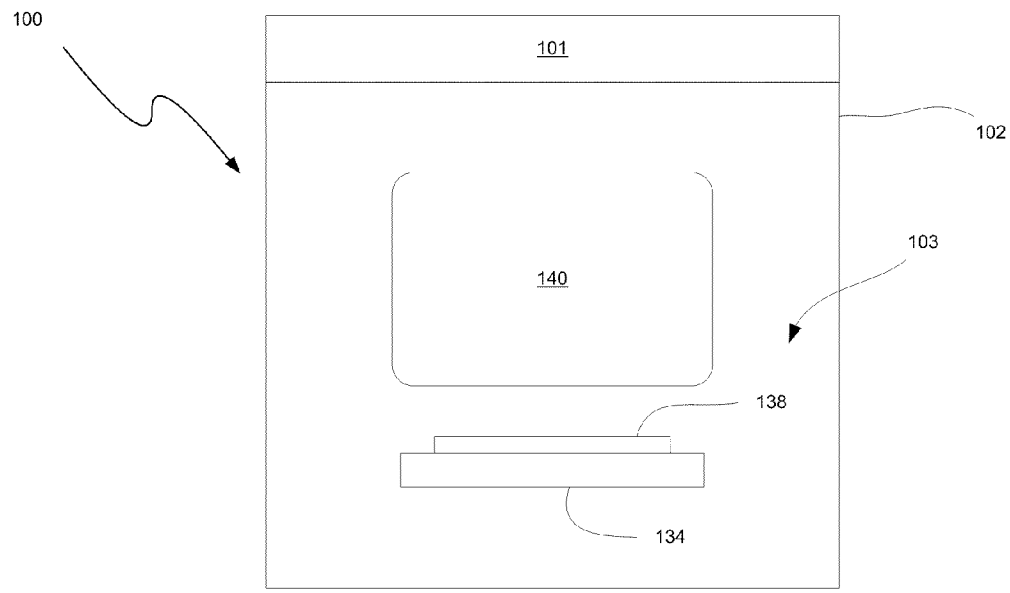
FIG. 9 is a block diagram of a plasma doping system.
Figure 10:
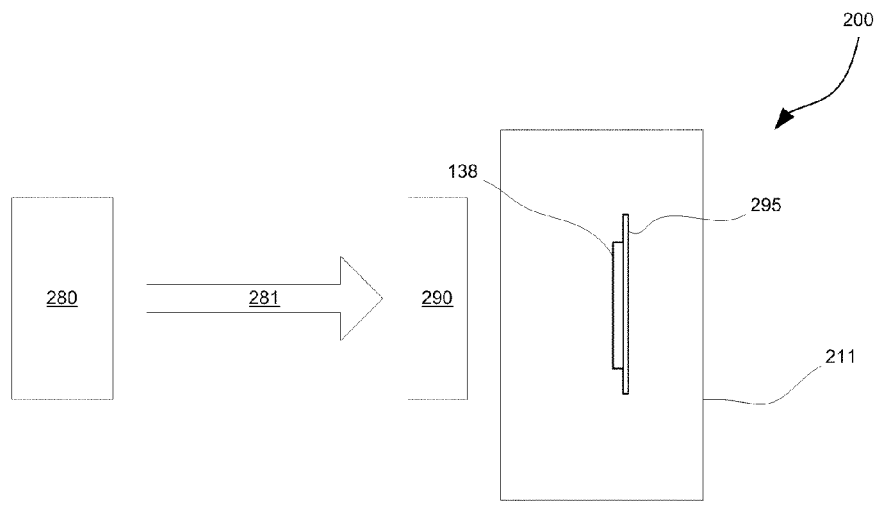
FIG. 10 is a block diagram of a beamline ion implanter.

In addition, the implants disclosed in the embodiments herein may be performed using either a plasma doping system 100 or a beamline ion implanter 200. FIG. 9 is a block diagram of a plasma doping system 100. FIG. 10 is a block diagram of a beamline ion implanter 200. Those skilled in the art will recognize that the plasma doping system 100 and the beamline ion implanter 200 are each only one of many examples of differing plasma doping systems and beamline ion implanters. Furthermore, those skilled in the art will recognize apparatuses, such as other plasma immersion or plasma flood tools, that also may be used for implanting a species. The implants disclosed in the embodiments herein may be performed using also may be performed in a cluster or stacked configuration tool.

Turning to FIG. 9, the plasma doping system 100 includes a process chamber 102 defining an enclosed volume 103. The process chamber 102 or workpiece 138 may be cooled or heated by a temperature regulation system (not illustrated). A platen 134 may be positioned in the process chamber 102 to support a workpiece 138. The platen 134 also may be cooled or heated by a temperature regulation system (not illustrated). In one instance, the workpiece 138 may be a semiconductor wafer having a disk shape, such as, in one embodiment, a 300 mm diameter silicon wafer. However, the workpiece 138 is not limited to a silicon wafer. The workpiece 138 could also be, for example, a flat panel, solar, or polymer substrate. The workpiece 138 may be clamped to a flat surface of the platen 134 by electrostatic or mechanical forces. In one embodiment, the platen 134 may include conductive pins (not shown) for making connection to the workpiece 138. The plasma doping system 100 further includes a source 101 configured to generate a plasma 140 from an implant gas within the process chamber 102. The source 101 may be an RF source or other sources known to those skilled in the art. The platen 134 may be biased. This bias may be provided by a DC or RF power supply. The plasma doping system 100 may further include a shield ring, a Faraday sensor, or other components. In some embodiments, the plasma doping system 100 is part of a cluster tool, or operatively-linked plasma doping chambers within a single plasma doping system 100. Thus, numerous plasma doping chambers may be linked in vacuum.

In operation, the source 101 is configured to generate the plasma 140 within the process chamber 102. In one embodiment, the source is an RF source that resonates RF currents in at least one RF antenna to produce an oscillating magnetic field. The oscillating magnetic field induces RF currents into the process chamber 102. The RF currents in the process chamber 102 excite and ionize the implant gas to generate the plasma 140. The bias provided to the platen 134, and, hence, the workpiece 138, will accelerate ions from the plasma 140 toward the workpiece 138 during bias pulse on periods. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

Turning to FIG. 10, a block diagram of a beamline ion implanter 200 is illustrated. Again, those skilled in the art will recognize that the beamline ion implanter 200 is only one of many examples of beamline ion implanters. In general, the beamline ion implanter 200 includes an ion source 280 to generate ions that are extracted to form an ion beam 281, which may be, for example, a ribbon beam or a spot beam. The ion beam 281 may be mass analyzed and converted from a diverging ion beam to a ribbon ion beam with substantially parallel ion trajectories in one instance. The beamline ion implanter 200 may further include an acceleration or deceleration unit 290 in some embodiments.

An end station 211 supports one or more workpieces, such as workpiece 138, in the path of the ion beam 281 such that ions of the desired species are implanted into workpiece 138. In one instance, the workpiece 138 may be a semiconductor wafer having a disk shape, such as, in one embodiment, a 300 mm diameter silicon wafer. However, the workpiece 138 is not limited to a silicon wafer. The workpiece 138 could also be, for example, a flat panel, solar, or polymer substrate. The end station 211 may include a platen 295 to support the workpiece 138. The end station 211 also may include in one embodiment a scanner (not shown) for moving the workpiece 138 perpendicular to the long dimension of the ion beam 281 cross-section, thereby distributing ions over the entire surface of workpiece 138.

The ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beamline ion implanter 200 may incorporate hot or cold implantation of ions in some embodiments.

The terms and expressions which have been employed herein are used as terms of description and not of limitation. There is no intention, in the use of such terms and expressions, of excluding any equivalents of the features shown and described (or portions thereof), and it is recognized that various modifications are possible. Other modifications, variations, and alternatives are also possible. Accordingly, the foregoing description is by way of example only and is not intended as limiting.

What is claimed is:

1. A method of reducing dark current in a photosensitive device on a workpiece, comprising:
selecting a first dose rate for a first species;
determining a difference between said first dose rate and an amorphization threshold for said first species and said workpiece;
selecting a first temperature based on said difference between said first dose rate and said amorphization threshold for said first species and said workpiece;
implanting ions of said first species into said workpiece to form a first doped region at said first temperature and said first dose rate;
selecting a second dose rate for a second species;
determining a difference between said second dose rate and an amorphization threshold for said second species and said workpiece;
selecting a second temperature based on said difference between said second dose rate and said amorphization threshold for said second species and said workpiece; and
implanting ions of said second species into said workpiece to form a second doped region above said first doped region at said second temperature and said second dose rate, wherein an entirety of said first doped region and said second doped region is amorphized during said implanting ions of said first species and said implanting ions of said second species, respectively.

2. The method of claim 1, wherein said first temperature is between +30° C. and −200° C. and said first dose rate of said first species is greater than said amorphization threshold of said first species and said workpiece.

3. The method of claim 1, wherein said second temperature is between +30° C. and −200° C. and said second dose rate of said second species is greater than said amorphization threshold of said second species and said workpiece.

4. The method of claim 1, wherein one of said first species and said second species is n-type and the other one of said first species and said second species is p-type.

* * * * *